(12) United States Patent
Greenberg et al.

(10) Patent No.: US 6,836,029 B2
(45) Date of Patent: Dec. 28, 2004

(54) MICRO-ELECTROMECHANICAL SWITCH HAVING A CONDUCTIVE COMPRESSIBLE ELECTRODE

(75) Inventors: David R. Greenberg, White Plains, NY (US); Hariklia Deligianni, Edgewater, NJ (US); Robert A. Groves, Highland, NY (US); Christopher V. Jahnes, Upper Saddle River, NJ (US); Jennifer L. Lund, Amawalk, NY (US); Katherine L. Saenger, Ossining, NY (US); Richard P. Volant, New Fairfield, CT (US)

(73) Assignee: International Business Machines Corporation, Armonk, NY (US)

( * ) Notice: Subject to any disclaimer, the term of this patent is extended or adjusted under 35 U.S.C. 154(b) by 299 days.

(21) Appl. No.: 09/996,148

(22) Filed: Nov. 28, 2001

(65) Prior Publication Data

US 2003/0098618 A1 May 29, 2003

(51) Int. Cl.[7] .................................................. H01H 3/00
(52) U.S. Cl. ......................... 307/139; 200/181; 307/134
(58) Field of Search ................................. 200/181, 511; 307/139, 134

(56) References Cited

U.S. PATENT DOCUMENTS

| | | | |
|---|---|---|---|
| 4,132,487 A | * 1/1979 | Fisher ..................... | 400/479.1 |
| 5,772,902 A | 6/1998 | Reed et al. ..................... | 216/2 |
| 5,901,939 A | 5/1999 | Cabuz et al. ........... | 251/129.02 |
| 6,331,257 B1 | * 12/2001 | Loo et al. ...................... | 216/13 |
| 6,384,353 B1 | * 5/2002 | Huang et al. ................ | 200/181 |
| 6,642,467 B2 | * 11/2003 | Farringdon .................. | 200/511 |

FOREIGN PATENT DOCUMENTS

| | | | | |
|---|---|---|---|---|
| JP | 2087489 | | 12/1991 | |
| JP | PUPA 11-260178 | | 9/1999 | |
| JP | PUPA 2000-57927 | | 2/2000 | |
| JP | PUPA 2000-348593 | | 12/2000 | |
| SU | 955255 A | * | 8/1982 | .......... H01H/13/26 |

* cited by examiner

Primary Examiner—Robert L. DeBeradinis
(74) Attorney, Agent, or Firm—H. Daniel Schnurmann

(57) ABSTRACT

A micro-electro mechanical switch having a restoring force sufficiently large to overcome stiction is described. The switch is provided with a deflectable conductive beam and multiple electrodes coated with an elastically deformable conductive layer. A restoring force which is initially generated by a single spring constant k0 upon the application of a control voltage between the deflectable beam and a control electrode coplanar to the contact electrodes is supplemented by adding to k0 additional spring constants k1, . . . , kn provided by the deformable layers, once the switch nears closure and the layers compress. In another embodiment, deformable, spring-like elements are used in lieu of the deformable layers. In an additional embodiment, the compressible layers or deformable spring-like elements are affixed to the deflecting beam facing the switch electrodes

15 Claims, 3 Drawing Sheets

MICRO-ELECTROMECHANICAL SWITCH HAVING A CONDUCTIVE COMPRESSIBLE ELECTRODE

FIELD OF THE INVENTION

This invention is generally related to micro-electromechanical switches, and more particularly to a structure and method for minimizing stiction between metal-to-metal contacts.

BACKGROUND OF THE INVENTION

A wide variety of communications systems, such as mobile phone handsets, are known to require switches for directing the signal flow between the systems. An example is the need to switch a mobile phone antenna between the phone transmitting and receiving blocks. Suitable switches must allow the signal to pass through with low loss in the on state (low insertion loss) and provide good isolation between terminals in the off state.

Micro-electromechanical switches have become an increasingly attractive option for radio frequency (RF) switching because of their potential for low insertion loss and high isolation. In one class of micro-electromechanical switches, one contact consisting of a conducting film, is made to move or deflect to come into contact with another and close the circuit. The contacts are then separated again to open the switch.

A significant problem plaguing present art micro-electromechanical contact switches is the fact that the electrodes tend to stick to one another upon contact, making it difficult to separate them in order to turn the switch off. This phenomenon, known as "stiction", is caused by the attraction at the microscopic level between atoms and molecules on the two surfaces. One solution is to ensure that when one contact plate is deflected to close the switch, the deflection creates a spring-like restorative force that naturally attempts to separate the contacts. If large enough, such a force can overcome stiction. However, the same force also implies that a large force must be generated to deflect the contact to close the device. In a switch wherein the deflection is electrostatic, this generally implies the need for a high control voltage beyond the 5V maximum that is required in, for instance, mobile handsets.

The stiction problem is not novel, and certain aspects of it have been described in the art. By way of example, in U.S. Pat. No. 5,772,902 to Reed et al., there is described a method for preventing adhesion of micro-electromechanical structures sticking to each other during fabrication. The structure described therein applies to micro-electromechanical systems but not to stiction that occurs during the operation of the switches. More particularly, the patent describes a method for shaping parts to avoid stiction when the part is fabricated and released.

Other solutions to modifying the restoring force of a micro-electromechanical switch have been described in the patent literature as, for instance, in U.S. Pat. No. 5,901,939 to Cabuz et al., wherein the use of multiple control electrodes and a specially shaped beam to create a stronger restoring force are described. The technique described, however, requires driving multiple electrode pairs in a two-phase configuration, which adds to the cost and complexity of the system employing such a switch. In addition, rather than using a deflecting beam, this switch relies on shifting a buckled region of a metal line toward one end of the line or the other, a technique which generates large flexure of the line and which can generate long-term reliability concerns.

The problem created by stiction during a transition of the switch from the on to the off state has been mainly addressed by investigating such a behavior when it occurs only during the manufacturing process and not during post-production switch operation. Further, most solutions fail in that they do not provide a continued use of a simple, single control electrode or multiple electrodes, all of which are actuated with voltages that are approximately in phase. Moreover, existing solutions fail to introduce an additional restoring force to the deflecting beam by means of a simple electrode coating rather than by employing a new type of beam that is difficult to manufacture and which is normally energized by buckling rather than by deflection (thus introducing high material stresses which have reliability implications).

OBJECTS OF THE INVENTION

Accordingly, it is an object of the present invention to provide a micro-electromechanical switch having a restoring force sufficiently large to overcome stiction, It is another object to provide the micro-electromechanical switch with multiple electrodes coated with an elastically deformable film or with a layer of mechanical, conductive, deformable elements.

It is still a further object to provide the micro-electromechanical switch with a restoring force which is initially governed by a single spring constant k0 upon first application of a control voltage, and which is then supplemented by additional spring constants k1 through kn once the switch is near closure.

It is yet another object to provide a micro-electromechanical switch wherein contact is made gradually instead of an entire planar surface coming into contact and having to break the contact at once.

It is still a further object to provide a micro-electromechanical switch such that a contact plate or beam is deflected to close the switch, the deflection creating a spring-like restorative force that naturally separates the contacts.

SUMMARY OF THE INVENTION

In addressing the above objects, the present invention discloses a switch that is energized by way of a low control voltage despite the stiction phenomenon.

The invention builds upon an established micro-electromechanical switching concept consisting of a deformable beam which is anchored at least on one end. A voltage between the beam and the control electrode causes the beam to bend, coming closer to the control electrode. At a sufficiently large voltage, the deflection enables the beam to contact a second electrode, completing the electric circuit and closing the switch. The control electrode is preferably coated with a non-conducting material or placed slightly below the plane of the switch electrode in order to avoid contacting the beam itself during switch closure.

In another aspect of the invention, the micro-electromechanical switch is provided with a deflecting beam designed to come into contact with one or more contacts (or switch electrodes) having a compressible coating which may be either a continuous film, possibly with a non-smooth contacting surface, or a collection of discrete spring-like elements. The multiple electrodes provided with the coating are elastically deformable and are provided with a surface which may be rough in its uncompressed mode but which becomes flat when compressed. In addition to making contact gradually rather than having an entire surface coming into contact and having to break that contact at once, there is an added elastic energy introducing a non-linear increase in the separating force as the switch comes near its closed position, which also helps to reduce the problem of stiction.

The present invention begins with a relatively well-studied structure, i.e., a deflecting beam switch. Such a switch is nominally governed by a single spring constant, $k0$. This invention adds at least one additional constant, $k1$, which is activated only once the switch is near closure. Thus, by adding a conductive, compressible element to the switch electrode, the switch begins to close using only a low control voltage to overcome the spring constant $k0$. Near closure, when $k1$ is activated, the restoring force of the switch increases. This permits the switch to overcome stiction and, thus, to open more readily. Since $k1$ is not activated until the switch is almost closed—at which point the gap between beam and control electrode is small—the required control voltage for completing switch closure remains low. This characteristic is highly desired in many modern applications for such switches, such as battery-powered cell phones.

Since the deflecting beam micro-electromechanical switch is governed by the main spring constant, $k0$, namely, that of the deflecting beam, it is not possible to facilitate opening the switch (i.e., ease contact stiction by increasing the spring constant) without also making it, at the same time, more difficult to close the switch. The consequence of this fact is a requirement for a large control voltage, which is contrary to the need of typical micro-mechanical switch applications, such as portable cellular phones operating from 3.6 to 7.2 volt batteries.

By introducing at least one additional spring constant, $k1$, the invention adds a new degree of freedom to the switch design. Upon initial application of the control voltage, the switch begins to close in a typical deflecting beam fashion, with the actuating force overcoming the spring constant $k0$. This constant is designed to be relatively low so as to allow a low control voltage. Part way through closure, however, spring constant $k1$ is turned on. A preferred mechanism is for the beam to contact a compressible, conductive coating on the switch electrode, causing it to compress. Spring constant $k1$ allows for a strong restorative force, helping the switch to overcome contact stiction and, thus, to open properly. However, $k1$ is not activated until the switch is almost fully closed and the gap between beam and control electrode is, thus, small. As a result, a low control voltage is sufficient to generate the force needed to overcome the sum of $k0$ and $k1$ and to allow proper closure of the switch.

In yet another aspect of the invention, the switch may also be implemented with multiple compressible layers stacked one on top of the other on the switch electrode, forming a layered coating and introducing additional spring constants $k1, k2 \ldots, kn$, where n represents the number of stacked layers. Such an arrangement allows the overall curve representing the restoring force as a function of beam deflection to be more precisely tailored compared with the case of a single compressible layer.

Further, the present invention may replace the compressible layer with a series of metal spring-like structures which are anchored and in electrical contact with the switch electrode on one end and which protrude into the gap above the switch electrode. As the beam is deflected by the control voltage with spring constant $k0$, it comes into contact with the deformable, spring-like elements, causing them to compress and introducing the additional spring constant $k1$. The principle of operation remains the same as in the case of the compressible film, but with the additional spring constant introduced by a mechanical spring-like structure rather than by a compressible film.

BRIEF DESCRIPTION OF THE DRAWINGS

These and other objects, aspects and advantages will become apparent from the following detailed description of a preferred embodiment of the invention when taken in conjunction with the accompanying drawings.

DETAILED DESCRIPTION OF THE INVENTION

Figure 1:
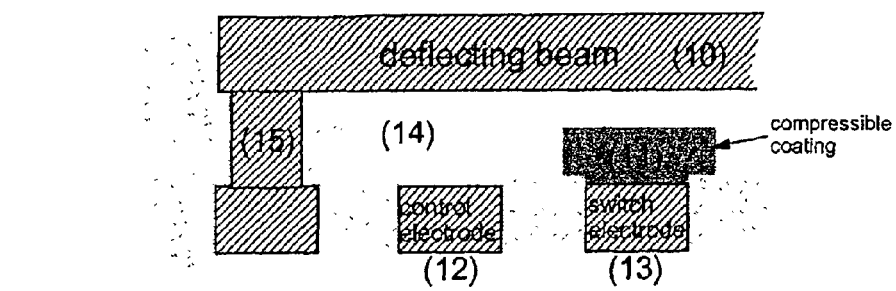
FIG. 1 is a cross-sectional view of a first embodiment of a micro-electromechanical switch according to the present invention, having a compressible elastic coating on top of the switching electrode. The switch is shown in its open state, with no control voltage applied to deflect the beam.

The present invention addresses the problem of stiction occurring while the switch is in operation and, more particularly, it provides a restoring force to overcome the remaining stiction after incorporating in the switch means for minimizing the stiction.

The invention builds upon a prior art microelectromechanical switch which, for illustrative purposes only, is a deformable beam which is anchored at least on one end. A voltage placed between the beam and a control electrode causes beam to bend in the direction of the control electrode. At a sufficiently large voltage, the deflection is sufficient for the beam to contact a second electrode, completing the electric circuit and closing the switch.

While there are many variants of this switch topology, a common property is that the voltage required to deflect the beam to the point of closing the switch is a function of three parameters: k, the spring constant of the beam itself; d1, the distance between the beam and control electrode (over which the control voltage must drop); and d2, the distance between the beam and the switch electrode (which determines how far the beam must deflect in order to make contact). Since the control and switch electrodes are typically coplanar, the distances between the beam and the control or switch electrodes are virtually the same, reducing the problem to a given spring constant, k, and a distance, d.

Given such a topology, and assuming that the control and switch electrodes are, for illustrative purposes, next to one another, the control voltage required to close the switch is proportional to both k and d. Generally, the distance d cannot be made smaller than some minimal distance set by the desired isolation of the switch in the off-state (to avoid signal leaking across the switch gap due to capacitive coupling). Thus, switch designers wishing to construct a switch that may be actuated with a low control voltage are left with only one degree of freedom, i.e., reducing the spring constant k. However, a spring constant that is too low will result in a restoring force that is insufficient to overcome stiction, leading to a switch that does not open once the control voltage is removed.

The invention addresses the relationship existing between the spring constant and the required control voltage. The invention creates a somewhat non-linear spring constant to facilitate the beam deflection (i.e., a low spring constant) for most of the deflection range, and letting it be more difficult (i.e., more spring constant) only at a point close to contact. This extra spring force near the point of contact allows the switch to overcome stiction. Further, since the extra spring force is only activated when the switch is near to its closing position, it implies that the force can be generated with a relatively low control voltage.

To create the extra non-linearity in the restoring force, the present invention describes coating the switch electrode by any number of means including plating, evaporation, deposition, and the like, with a layer or multiple layers of conducting material having the property of being compressible and storing elastic energy. One example of such a material is the polymer matrix Parylene, which may be embedded with a fine powder of metal balls to make it conductive. This material is readily available from a number of commercial sources. Another such material is ACF (anisotropic electrically conductive film), which is typically used in a different application: LCD displays, are described, e.g., in the article entitled "Micropitch connection using anisotropic conductive materials for driver IC attachment to a liquid crystal display" by Nishida et. al., published in the IBM Journal for Research and Development, Vol. 42, No. 3/4, May/July 1998. A further example of a suitable compressible material is a collection of mechanical, spring-like elements or structures placed upon and protruding from the switch electrode. Such structures may be formed using, e.g., the same industry-standard lithographic methods that create the electrodes themselves.

A preferred embodiment of the invention is illustrated in FIG. 1. The switch shown therein consists of at least one control electrode (12) and at least one switching electrode (13), both of which are conductive and positioned across a cavity or gap (14) surrounding the deflectable beam (10). Beam (10) is made of a conductive material, and is anchored at least on one end (15). At least one switching electrode is coated with at least one compressible, conductive layer (11) that is in electrical contact with the switching electrode and which is separated from the beam by the gap (14) when the switch is "off", i.e., when no control voltage is applied.

Figure 2:
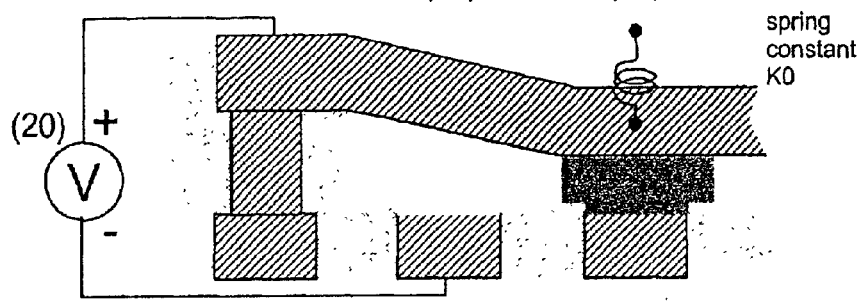
FIG. 2 shows a cross-sectional view of the switch illustrated in FIG. 1 in operation, with a control voltage applied between the beam and the control electrode and the beam deflecting under a spring constant $k0$.
Figure 3:
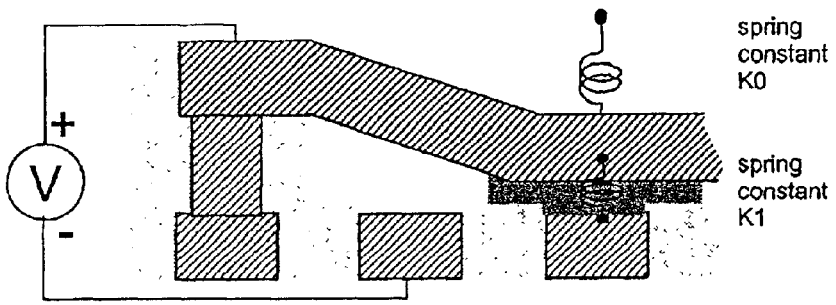
FIG. 3 shows a cross-sectional view of the switch in operation, with a control voltage between the moveable beam and the control electrode, wherein the beam deflects further than depicted in FIG. 2. The beam is shown contacting a compressible, conductive layer coating the switch electrode, causing it to compress under an additional spring constant $k1$.

Referring now to FIG. 2, the beam is shown deflected with a spring constant k0 toward both control and switch electrodes under a control voltage (20) between the beam and one or more of the control electrodes, coming in contact with the compressible, conductive layer. This contact closes the switch and compresses the compressible, conductive layer with the added spring constant k1, as shown in FIG. 3. The compression of the conductive layer adds to the restorative force that forces the switch to open when the control voltage is removed.

Figure 4:
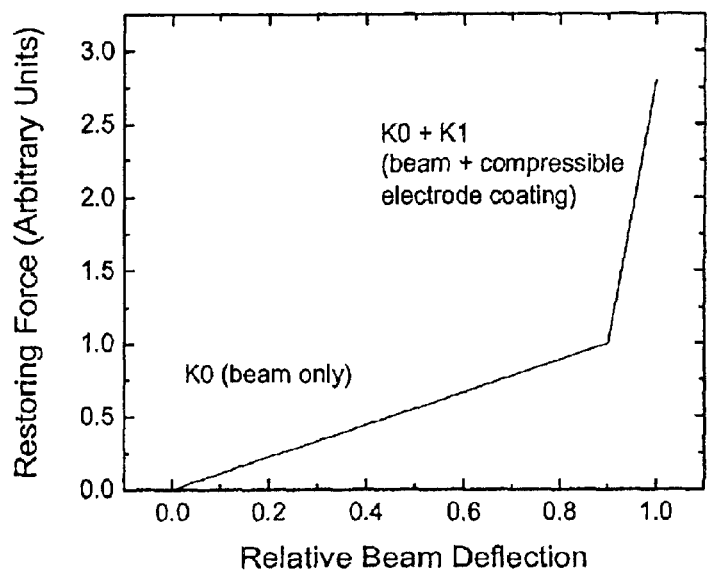
FIG. 4 is a plot illustrating the restorative force (in arbitrary units) as a function of the relative beam deflection (0=fully open, 1=fully closed), and showing the impact of the two spring constants.

FIG. 4 is a plot showing how the restorative force varies as a function of the beam deflection, wherein the force is given in arbitrary units. Binary value '0' is indicative of no beam deflection (i.e., the switch is in an open position) and '1' represents the full beam deflection (i.e., the switch is in a closed position). The restoring force increases linearly at a slope determined by spring constant k0 to the point where the added spring constant k1 is activated. Then, the restorative force increases linearly with a new slope determined by k0+k1 until the beam is fully deflected.

Figure 5:
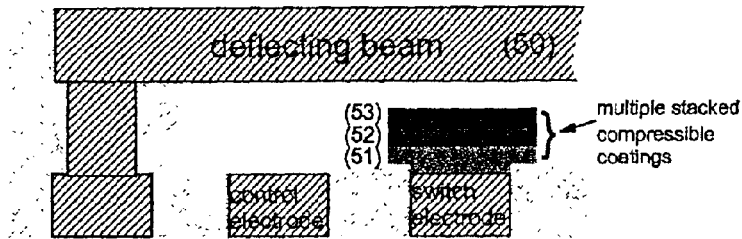
FIG. 5 shows a cross-sectional view of an alternate embodiment, wherein the switch electrode is coated with a stack of multiple conductive compressible films, each with its own spring constant, which allows further tailoring of the restorative force. For illustrative purposes, three layers are shown, although any number of layers greater than or equal to one may be used.

An alternate embodiment of the present invention is shown in FIG. 5. Rather than a single compressible, conductive layer constructed on top of the switch electrode, multiple such layers (51), (52), and (53) are shown, each with possibly a different spring constant. These layers are preferably stacked upon the switch electrode. Although three such layers are shown for illustrative purposes, it is evident that any number of layers is permissible. The switch operates in identical fashion to that of FIG. 1. When the deflecting beam (50) comes into contact with the stack of compressible, conductive layers, the multiple layers are compressed under multiple additional spring constants k1 through kn (where n is an integer greater than 1 representing the number of layers). Such an arrangement permits more precise tailoring of the restorative force versus beam deflection when compared to the embodiment shown in FIG. 1.

Figure 6:
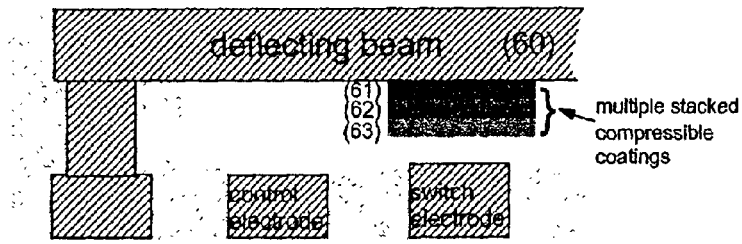
FIG. 6 shows a cross-sectional view of another embodiment of the invention, wherein the deflecting beam, rather than the switch electrodes, are coated with a stack of multiple conductive compressible films, each having its own spring constant, thereby allowing further tailoring of the restorative force. For illustrative purpose, three layers are shown, although any number of layers greater than or equal to one may be used.

In a further embodiment shown in FIG. 6, one may recognize that the same tailoring of the switch restorative force can be achieved by coating the underside of the deformable switch beam (60) with multiple compressible conductive layers (61), (62), and (63). Three such layers are shown for illustrative purposes, although any number of layers is permissible. Practitioners of the art will recognize that the embodiments shown in FIGS. 5 and 6 may be combined by placing multiple compressible layers both on top of the switch electrode and/or below the deformable beam.

Figure 7:
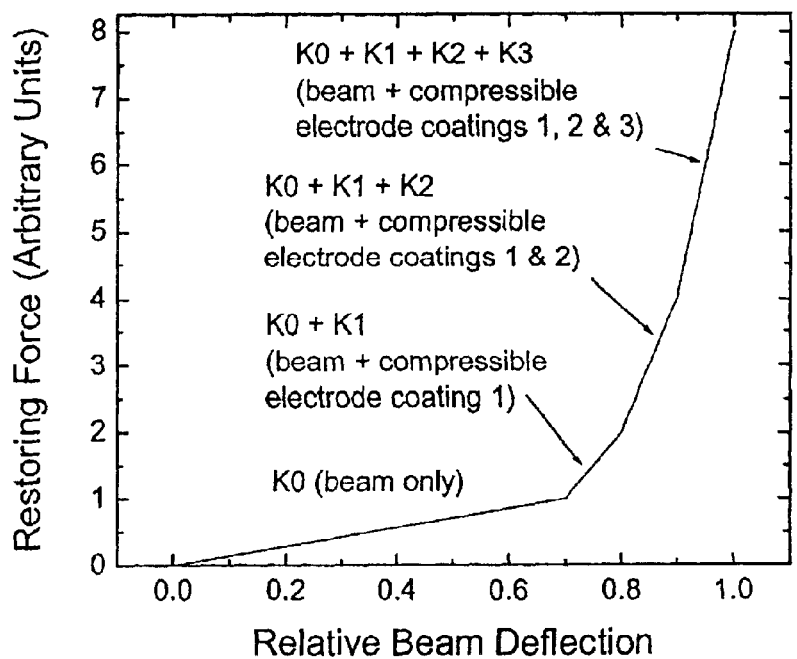
FIG. 7 is a plot illustrating the restorative force applicable to the embodiment of the invention described with reference to FIGS. 5 and 6 (in arbitrary units) as a function of the relative beam deflection (0=fully open, 1=fully closed), and showing the impact of the multiple spring constants (i.e., $k1$, $k2$ and $k3$).

FIG. 7 is a plot illustrating the behavior of the tailored restorative force applicable to the embodiments of FIGS. 5 and 6 as a function of beam deflection. The interpretation of the coordinate axes is identical to FIG. 4. The restoring forces increases linearly with respect to the relative beam deflection, initially with a slope determined by the spring constant k0. Upon coming into contact with layer 61, the slope changes to k0+k1. When layer 62 comes into contact, the slope changes to k0+k1+k2. Finally, when layer 63 comes into contact, the slope changes once again, this time to k0+k1+k2+k3 and remains at that slope until the switch fully closes.

Figure 8:
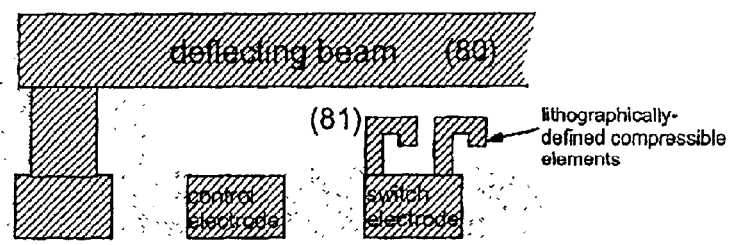
FIGS. 8 and 9 show cross-sectional views of two implementations of the embodiments of FIG. 7. In lieu of a compressible, conductive layer(s) placed upon the switch electrode as shown in FIGS. 1, 5 and 6, the switch electrode is coated with a plurality of mechanical, conductive, spring-like elements.
Figure 9:
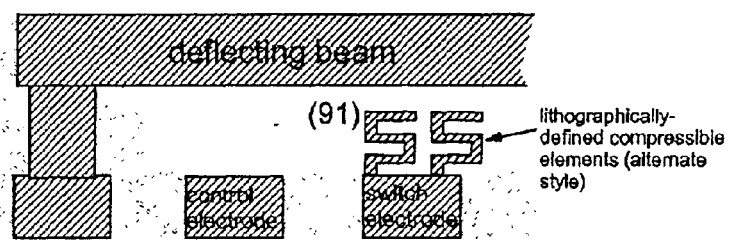
Figure 10:
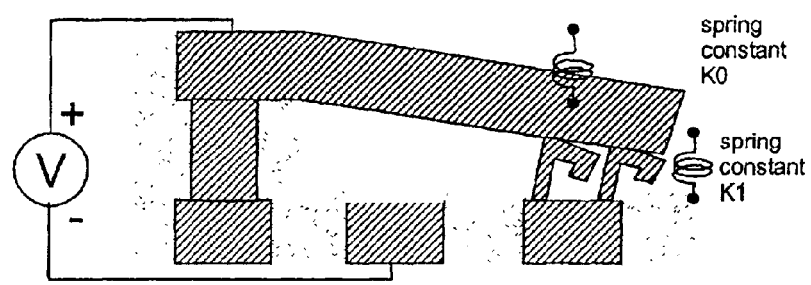
FIG. 10 illustrates the switch shown in FIG. 8 in operation, with the beam deflected by way of spring constant $k0$, with the beam making contact and compressing the mechanical, conductive spring-like structures attached to the switch electrode.

Two additional embodiments of the present invention are, respectively, illustrated in FIGS. 8 and 9. The principle of operation remains the same as described with reference to FIG. 1. However, in FIG. 8, the compressible, conductive layer on top of the switch electrode is replaced with compressible, conductive mechanical spring-like protrusions (81). These elements are shown attached to the switch electrode on one end and extending into the gap formed by the electrode and beam (80). The structure of FIG. 9 is similar to that of FIG. 8 but it illustrates an alternate shape for the mechanical spring-like protrusion (91) coating the switch electrode. Upon application of the control voltage, the beam deflects under spring constant k0, ultimately establishes contact with the spring-like elements. This action closes the switch and compresses the spring-like structures (91) by way of an additional spring constant k1, as shown in FIG. 10. This compressive force adds to the restorative force of the switch. These spring-like elements are designed to exhibit a spring constant which changes as the spring-like elements are compressed, allowing further tailoring of the relationship between the restorative force and the deflection of the beam. The mechanical deformable elements may also be attached to the underside of the deflecting beam rather than on top of the switch electrode.

While the invention has been described in conjunction with several preferred embodiments, it is to be understood that many alternatives, modifications, and variations will be apparent to those skilled in the art in light of the foregoing description. Accordingly, it is intended to embrace all such alternatives, modifications, and variations which fall within the spirit and scope of the appended claims. All matters set forth herein and shown in the accompanying drawings are to be interpreted in an illustrative and non-limiting sense.

What is claimed is:

1. A micro-electromechanical switch comprising:
    at least one electrode; and
    a deflecting beam, said deflecting beam being attracted by said at least one electrode in the presence of an actuation voltage, said deflecting beam contacting said at least one electrode by way of a compressible deformable means affixed to at least one end of said deflecting beam or to at least one of said electrodes,
    wherein said compressible deformable means initiates a non-linear increase to a separating force able to overcome stiction when said compressible deformable means is being compressed as the micro-electromechanical switch nears its closed position, and
    wherein the increase in said separating force is proportional to the increasing closing force provided by said actuation voltage as the deflecting beam nears said at least one electrode.

2. The micro-electromechanical switch as recited in claim 1, wherein said compressible deformable means is selected from the group consisting of a layer and discrete spring-like elements protruding from said at least one electrode.

3. The micro-electromechanical switch as recited in claim 1 wherein said at least one electrode is an actuation electrode or a contact electrode.

4. The micro-electromechanical switch as recited in claim 3, wherein the deflection of said deflecting beam is governed by applying a voltage between said deflecting beam and said actuation electrode.

5. The micro-electromechanical switch as recited in claim 4, wherein the voltage required to deflect said deflectable beam to close the micro-electromechanical switch is dependent on k0, the spring constant of said deflectable beam; on the distance between said deflectable beam and said actuation electrode; and on the distance between said deflectable beam and said electrode.

6. The micro-electromechanical switch as recited in claim 1, wherein said compressible deformable means enables a sequential activation of spring constants k0, k1, k2, . . . , kn, wherein n is an integer greater than or equal to 1, as the micro-electromechanical switch closes, allowing said switch to overcome stiction.

7. The micro-electromechanical switch as recited in claim 1, wherein said compressible deformable means is a layer affixed to said at least one electrode, said layer being made of a material selected from the group consisting of polymer matrix Parylene and anisotropic electrically conductive film (ACF).

8. The micro-electromechanical switch as recited in claim 1 wherein said separating force able to overcome stiction depends on spring constants k1, . . . , kn, said separating force being sequentially added to the force dependent on k0, the spring constant of said deflectable beam, and wherein said separating force depending on spring constants k1, . . . kn, is only activated by the compression of said compressible deformable means.

9. A micro-electromechanical switch comprising:
    at least one contact electrode;
    an actuation electrode coplanar to said at least one contact electrode; and
    a deflecting beam, said deflecting beam contacting said contact electrode, wherein a compressible elastically deformable means is affixed to a surface of either said deflecting beam or said at least one contact electrode,
    wherein said compressible deformable means initiates a non-linear increase to a separating force able to overcome stiction when said compressible deformable means is being compressed as the micro-electromechanical switch nears its closed position, and
    wherein the increase in said separating force is proportional to the increasing closing force provided by said actuation voltage as the deflecting beam nears said actuation electrode.

10. The micro-electromechanical switch as recited in claim 9, wherein said deflecting beam is deflected by a voltage applied between said actuation electrode and said deflecting beam.

11. The micro-electromechanical switch as recited in claim 9, wherein said compressible elastically deformable means are discrete spring-like elements protruding from said at least one contact electrode or said deflecting beam.

12. A micro-electromechanical switch comprising:
    at least one electrode;
    a deflectable conductive beam anchored at one end thereof and positioned within a cavity surrounding said deflectable beam, wherein at least one electrode is coated with at least one compressible, conductive layer that is in electrical contact with said at least one electrode and which is separated from said deflectable conductive beam by said cavity when the micro-electromechanical switch is in an "off" state, wherein said compressible deformable means initiates a non-linear increase to a separating force able to overcome stiction when said compressible deformable means is being compressed as the micro-electromechanical switch nears its closed position, and wherein the increase in said separating force is proportional to the increasing closing force provided by said actuation voltage as the deflecting beam nears said actuation electrode.

13. The micro-electromechanical switch as recited in claim 12, wherein said deflectable conductive beam is deflected by a force toward said at least one actuating electrode, said force being dependent on a spring constant k0 generated by a voltage applied between said deflectable conductive beam and said at least one actuating electrode, making contact with said compressible, conductive layer.

14. The micro-electromechanical switch as recited in claim 13, wherein said deflectable beam closes the micro-electromechanical switch and compresses said compressible, conductive layer with a force dependent on an added spring constant k1, said compression of said compressible, conductive layer adding to a restorative force that restores the micro-electromechanical switch to an open position when said voltage is removed.

15. The micro-electromechanical switch as recited in claim 14, wherein said compressible, conductive layer is positioned on a surface of said at least one switching electrode, said compressible, conductive layer comprising multiple stacked layers, with at least one of said multiple stacked layers having a different spring constant.

* * * * *